(12) United States Patent
Lee et al.

(10) Patent No.: US 7,176,072 B2
(45) Date of Patent: Feb. 13, 2007

(54) STRAINED SILICON DEVICES TRANSFER TO GLASS FOR DISPLAY APPLICATIONS

(75) Inventors: Jong-Jan Lee, Camas, WA (US); Jer-Shen Maa, Vancouver, WA (US); Sheng Teng Hsu, Camas, WA (US)

(73) Assignee: Sharp Laboratories of AMerica, Inc, Camas, WA (US)

( * ) Notice: Subject to any disclaimer, the term of this patent is extended or adjusted under 35 U.S.C. 154(b) by 77 days.

(21) Appl. No.: 11/046,411

(22) Filed: Jan. 28, 2005

(65) Prior Publication Data

US 2006/0172467 A1   Aug. 3, 2006

(51) Int. Cl.
*H01L 21/84* (2006.01)
*H01L 21/00* (2006.01)
*H01L 21/658* (2006.01)

(52) U.S. Cl. ............ 438/149; 438/455; 438/257; 438/456; 438/150; 438/151; 257/E23.065; 257/E21.499; 257/E21.705; 257/21.334; 257/E21.568; 257/E21.126; 257/E21.658

(58) Field of Classification Search ......... 438/149, 438/150, 151, 455
See application file for complete search history.

(56) References Cited

U.S. PATENT DOCUMENTS

| | | |
|---|---|---|
| 5,158,907 A | 10/1992 | Fitzgerald, Jr. |
| 5,891,769 A | 4/1999 | Liaw et al. |
| 6,458,619 B1 * | 10/2002 | Irissou .................. 438/66 |
| 6,525,338 B2 | 2/2003 | Mizushima et al. |
| 6,583,000 B1 | 6/2003 | Hsu et al. |
| 6,649,480 B2 * | 11/2003 | Fitzgerald et al. ........ 438/285 |
| 6,812,081 B2 * | 11/2004 | Yamazaki et al. ........ 438/197 |
| 6,852,652 B1 * | 2/2005 | Maa et al. ............... 438/197 |
| 6,897,516 B2 * | 5/2005 | Mehrad et al. .......... 257/315 |
| 6,900,108 B2 * | 5/2005 | Kurtz et al. .............. 438/406 |
| 6,904,089 B1 * | 6/2005 | Sueyoshi et al. ........ 375/240 |
| 6,953,736 B2 * | 10/2005 | Ghyselen et al. ....... 438/458 |
| 7,045,441 B2 * | 5/2006 | Chang et al. ........... 438/458 |
| 7,067,430 B2 * | 6/2006 | Maa et al. ............... 438/705 |
| 7,078,353 B2 * | 7/2006 | Daval et al. ............. 438/763 |
| 2003/0080399 A1 * | 5/2003 | Hedler et al. ........... 257/678 |

(Continued)

OTHER PUBLICATIONS

U.S. Appl. No. 10/755,615, filed Jan. 12, 2004, Maa et al.

(Continued)

*Primary Examiner*—Walter Lindsay, Jr.
*Assistant Examiner*—Thu-Huong Dinh
(74) *Attorney, Agent, or Firm*—Robert D. Varitz, PC

(57) ABSTRACT

A method of fabricating strained silicon devices for transfer to glass for display applications includes preparing a wafer having a silicon substrate thereon; forming a relaxed SiGe layer on the silicon substrate; forming a strained silicon layer on the relaxed SiGe layer; fabricating an IC device on the strained silicon layer; depositing a dielectric layer on the wafer to cover a gate module of the IC device; smoothing the dielectric; implanting ions to form a defect layer; cutting the wafer into individual silicon dies; preparing a glass panel and the silicon dies for bonding; bonding the silicon dies onto the glass panel to form a bonded structure; annealing the bonded structure; splitting the bonded structure along the defect layer; removing the remaining silicon layer from the silicon substrate and relaxed SiGe layer on the silicon die on the glass panel; and completing the glass panel circuitry.

12 Claims, 3 Drawing Sheets

U.S. PATENT DOCUMENTS

2006/0019464 A1*  1/2006  Maa et al. .................. 438/458
2006/0030124 A1*  2/2006  Maa et al. .................. 438/459

OTHER PUBLICATIONS

U.S. Appl. No. 10/894,685, filed Jul. 20, 2004, Maa et al.
Tai et al., *Performance of Poly-Si TFTs fabricated by SELAX*, IEEE Trans. Electron Devices, vol. 51, No. 6, pp. 934-939 (2004).
Mizuki et al., *Large Domains of Continuous Grain Silicon on Glass Substrate for High-Performance TFTs*, IEEE Trans. Electron Devices, vol. 51, No. 2, pp. 204-211 (2004).
Walker et al., *Improved Off-Current and Subthreshold Slope in Aggressively Scaled Poly-Si TFTs With a Single Grain Boundary in the Channel*, IEEE Trans. Electron Devices, vol. 51, No. 2, pp. 212-219 (2004).

Shi et al., *Characterization of Low-Temperature Processed Single-Crystalline Silicon Thin-Film Transistor on Glass*, IEEE Electron Device Letters, vol. 24, No. 9, pp. 574-576 (2003).

* cited by examiner

STRAINED SILICON DEVICES TRANSFER TO GLASS FOR DISPLAY APPLICATIONS

FIELD OF THE INVENTION

This invention relates to fabrication of IC devices on strained silicon and transfer to glass, for display and sensor applications, and specifically to fabrication of a strained silicon thin film transistor on silicon-on-glass.

BACKGROUND OF THE INVENTION

Thin film transistors (TFTs) with better performance are required for incorporation into the next generation of mobile and high resolution displays to facilitate incorporation of functional circuits, such as controller, drivers, etc., on the same substrate as the pixel array. Such displays require TFTs which have low power consumption, low threshold voltages, a steep subthreshold slope, and high carrier mobility. Although many researchers have focused on polysilicon TFTs to achieve these goals, Tai et al., *Performance of Poly-Si TFTs fabricated by SELAX*, IEEE Trans. Electron Devices, Vol. 51, No. 6, pp 934–939 (2004); and Mizuki et al., *Large Domains of Continuous Grain Silicon on Glass Substrate for High-Performance TFTs*, IEEE Trans. Electron Devices, Vol. 51, No. 2, pp 204–211 (2004), the common objective is to reduce the grain boundaries and hence improve the TFT performance; Walker et al., *Improved Off-Current and Subthreshold Slope in Aggressively Scaled Poly-Si TFTs With a Single Grain Boundary in the Channel*, IEEE Trans. Electron Devices, Vol. 51, No. 2, pp 212–219 (2004).

In order to alleviate the grain boundary problem all together, single crystalline silicon TFTs have been demonstrated, Shi et al., *Characterization of Low-Temperature Processed Single-Crystalline Silicon Thin-Film Transistor on Glass*, IEEE Electron Device Letters, Vol. 24, No. 9, pp 574–576 (2003). A single crystalline silicon layer on glass was fabricated using an "ion-cutting" based layer transfer technique. A hydrogen implanted silicon wafer is first bonded to a glass wafer. A thin silicon film is next exfoliated from the silicon wafer and transferred to the glass wafer. The single crystalline silicon TFTs exhibited significantly higher electron mobility (~430 $cm^2$/V-sec), a steeper subthreshold slope and a lower leakage current, which was also relatively less sensitive to gate bias than previous known TFTs.

To further improve the TFT performance, TFTs fabricated on strained-silicon-on-glass (SSOG) wafer have been described by Maa et al., *Method of Making Silicon-on-Glass via Layer Transfer*, U.S. patent application Ser. No. 10/894,685, filed Jul. 20, 2004 (SLA.0864); and Maa et al., *Strained Silicon-on-Insulator from Film Transfer and Relaxation by Hydrogen Implantation*, U.S. patent application Ser. No. 10/755,615, filed Jan. 12, 2004 (SLA.0822). The strained silicon TFTs on glass demonstrated an effective electron mobility up to 850 $cm^2$/V-sec, or nearly twice that of the single crystalline silicon TFT.

SUMMARY OF THE INVENTION

A method of fabricating strained silicon devices for transfer to glass for display applications includes preparing a wafer having a silicon substrate thereon; forming a relaxed SiGe layer on the silicon substrate; forming a strained silicon layer on the relaxed SiGe layer; fabricating an IC device on the strained silicon layer; depositing a dielectric layer on the wafer to cover a gate module of the IC device; smoothing the dielectric; implanting ions to form a defect layer; cutting the wafer into individual silicon dies; preparing a glass panel and the silicon dies for bonding; bonding the silicon dies onto the glass panel to form a bonded structure; annealing the bonded structure; splitting the bonded structure along the defect layer; removing the remaining silicon layer from the silicon substrate and relaxed SiGe layer on the silicon die on the glass panel; and completing the glass panel circuitry.

It is an object of the invention to fabricate IC devices on a strained silicon-on-SiGe virtual substrate and then transfer the IC device and a portion of the substrate onto a glass substrate.

It is an object of the invention to fabricate CMOS devices on a strained silicon-on-SiGe virtual substrate and then transfer the CMOS device and a portion of the substrate onto a glass substrate.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The purpose of this invention is to fabricate an IC device, such as a CMOS device, on strained silicon on SiGe virtual substrate, and then transfer the device onto a glass substrate. There are two distinct advantages to this technique: (1) the strained silicon device has high carrier mobility. Usually, the performance of strained silicon devices is two times better than that of a regular silicon device. The performance of a regular silicon device is at least 1–4 times better than that of a like device fabricated on polysilicon. The use of strained silicon devices for the peripheral circuits on glass provides a small size, high resolution, fast response, light weight and low-power consuming mobile LCD panel; and, (2) compared to a transferred regular non-strained silicon device onto a glass substrate, the use of a SiGe virtual substrate on strained silicon provides a smooth surface for the final silicon device, because of the high etch selectivity between SiGe and silicon.

It is commercially feasible to transfer a strained silicon film onto a glass substrate, and then to fabricate a device on the glass-bearing strained silicon film, when both the peripheral driver circuits and the pixel TFT devices use strained silicon. Usually, the requirements for the pixel TFT devices are much less constrained than are the requirements for any peripheral driver circuits, thus, the pixel TFTs may be fabricated with amorphous silicon or polycrystalline silicon.

In the method of the invention, the strained silicon CMOS devices is fabricated on a SiGe virtual substrate until interlayer dielectric (ILD) formation. Hydrogen ions are implanted into the silicon substrate or the SiGe layer. After die cutting, the device is bonded to the glass substrate. Splitting is performed by thermal anneal. Thinning the transferred die is accomplished by a combination of dry etch, CMP, and finally, selective SiGe removal. The smooth strained silicon thin film transistors are bonded to the glass substrate. Interconnection between and within the peripheral circuits and the pixel TFTs are processed after completing the strained silicon devices transfer.

Figure 1:
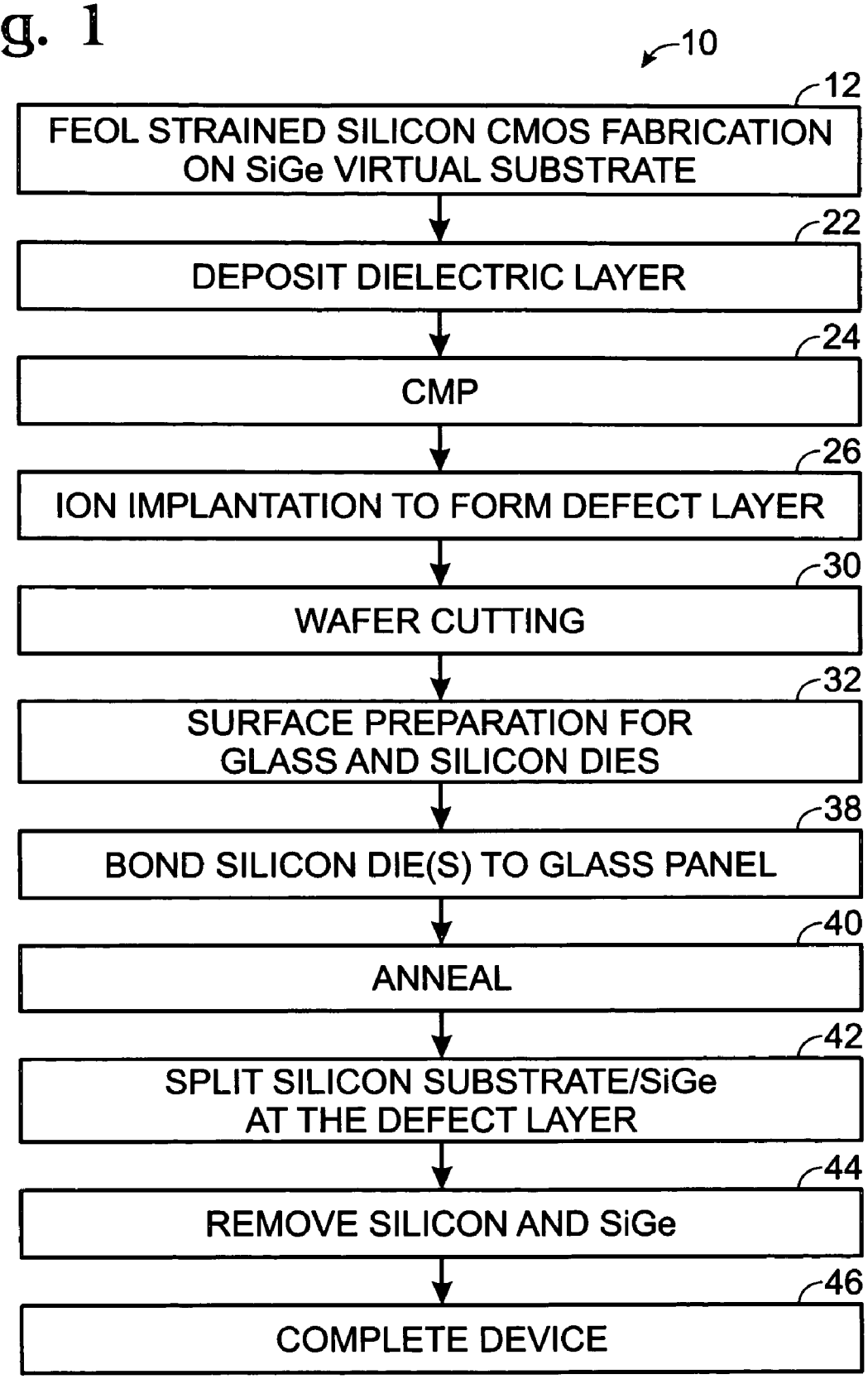
FIG. 1 is a block diagram of the method of the invention.
Figure 2:
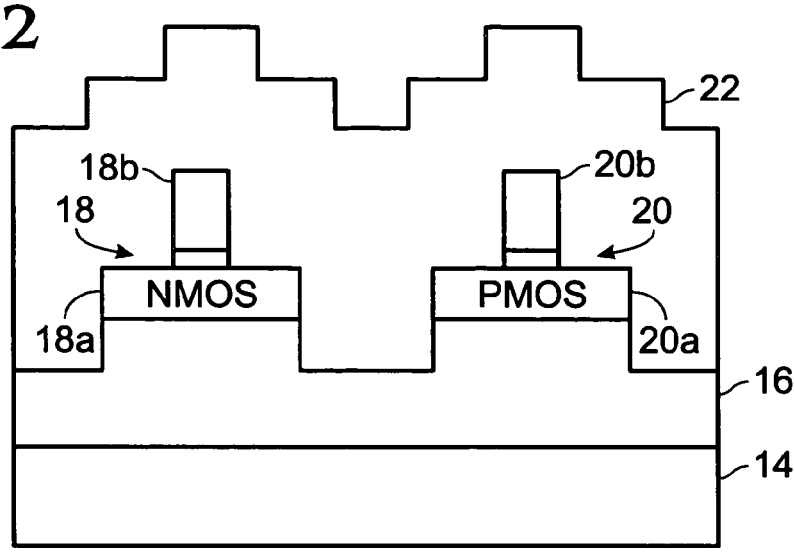
FIGS. 2–6 depict various steps in the method of the invention.

Referring now to FIGS. 1 and 2, the method of the invention is depicted generally at 10 in FIG. 1, and the initial step of the method of the invention is depicted in FIG. 2. Front end of line (FEOL) strained silicon processes, such as CMOS fabrication, on SiGe virtual substrate by the state-of-art IC process technology, is completed, 12, which includes, preparation of a silicon substrate 14, formation of a relaxed SiGe layer 16 on the silicon substrate, and CMOS fabrication, including NMOS 18 and PMOS 20 fabrication. NMOS 18 and PMOS 20 have a strained silicon layer 18a, 20a and a gate 18b, 20b, respectively. The SiGe thickness on the SiGe virtual substrate ranges from 0.1 µm to 10 µm. The strained silicon layer thickness has a range of between about 5 nm to 100 nm. A dielectric layer 22 is deposited on the wafer to cover the gate module. Because of the isolation and gate formation, the wafer surface is not smooth after dielectric deposition. The dielectric is smoothed by CMP, or other means, 24.

Figure 3:
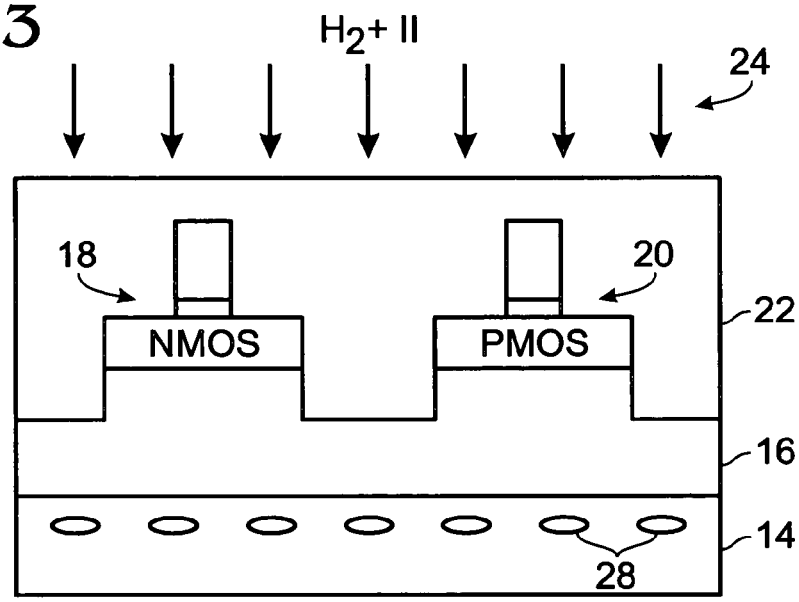

FIG. 3 depicts an ion implantation step 26, wherein ions are implanted into SiGe layer 16 or silicon substrate 14. As depicted in FIG. 3, the ions are implanted into silicon substrate 14, forming a defect layer 28. The ions may be $H^+$, $H_2^+$, $Ar^+$, or $He^+$, and may be implanted alone, or in combination(s). Ion implantation is preformed to facilitate subsequent wafer splitting. The implantation dose is in a range of between about $1\times10^{16}$ $cm^{-2}$ to $8\times10^{16}$ $cm^{-2}$. The wafer is then cut into individual silicon dies, 30.

Figure 4:
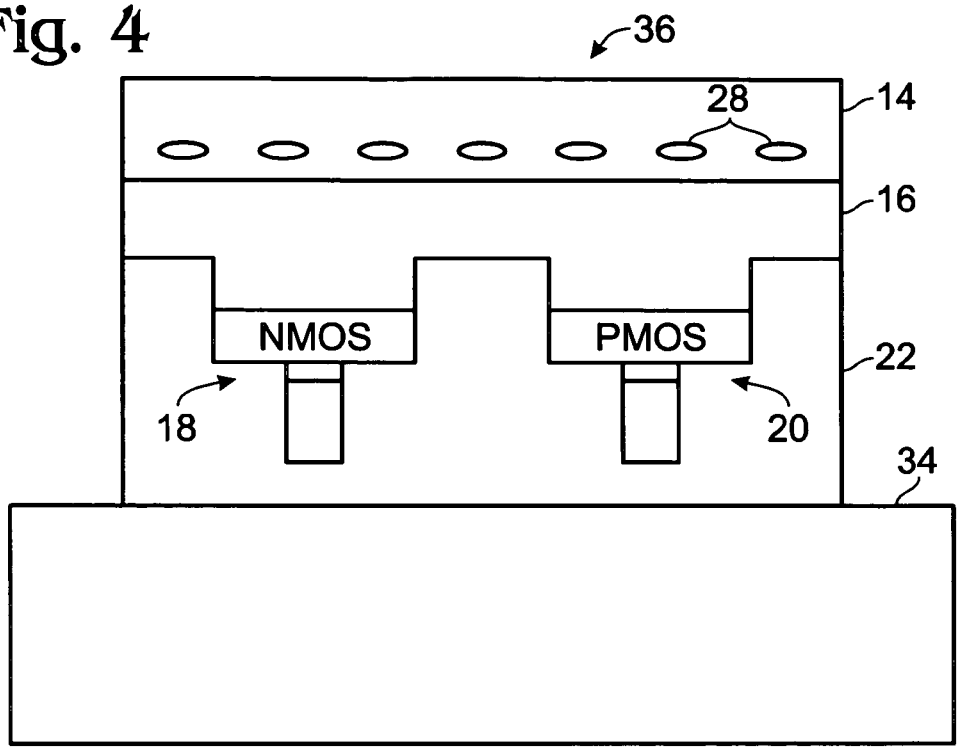

FIG. 4 depicts the structures used in the method of the invention after surface preparation 32 of a glass panel 34 and a silicon die 36. The silicon dies are bonded 38 onto the glass panel. A number of dies may be bonded to a single glass panel, and the glass panel may or may not, at this stage of the method of the invention, have pixel TFTs built thereon.

Figure 5:
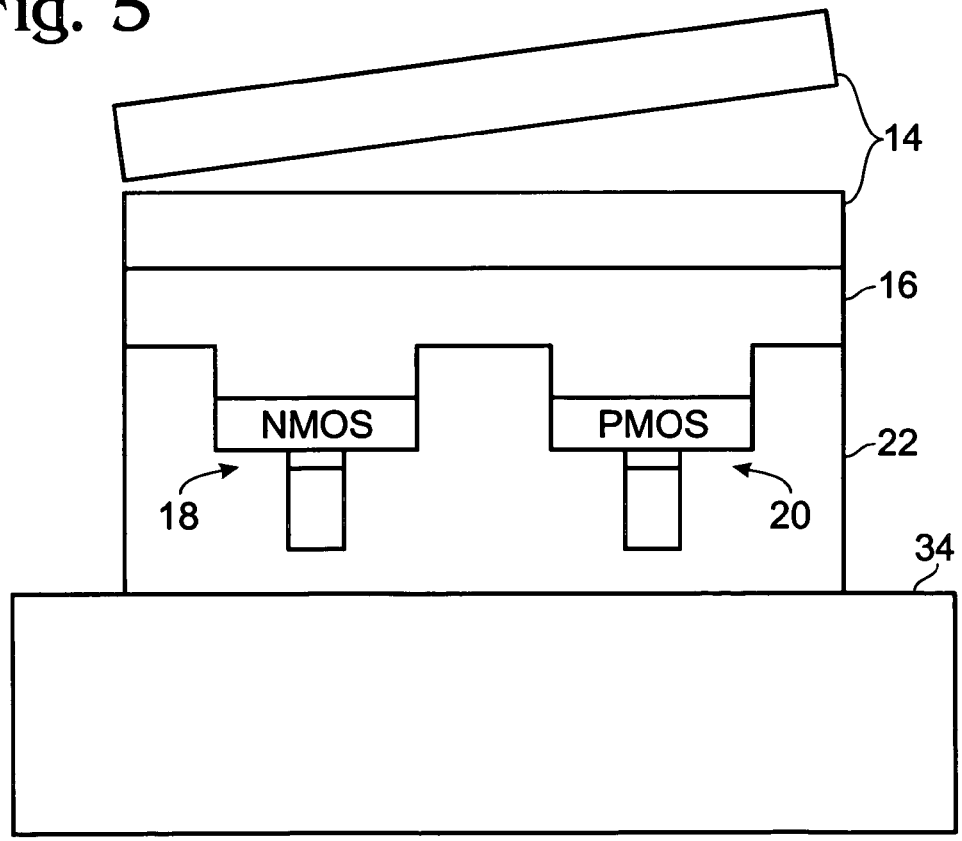

FIG. 5 depicts the bonded glass panel 34 and a single silicon die 36 after an annealing step 40 and splitting step 42, wherein the silicon substrate, in this case, is split along the defect layer by thermal annealing, which takes place at a temperature of between about 250° C. to 600° C. for between about ten minutes to ten hours. The splitting plane will be in SiGe layer 16 or in silicon substrate 14, depending on where defect layer 28 is formed, and the location of the splitting within the layer will depend on the depth of the defect layer, i.e., on the implantation energy. In this example, the splitting plane is in silicon substrate 14.

Figure 6:
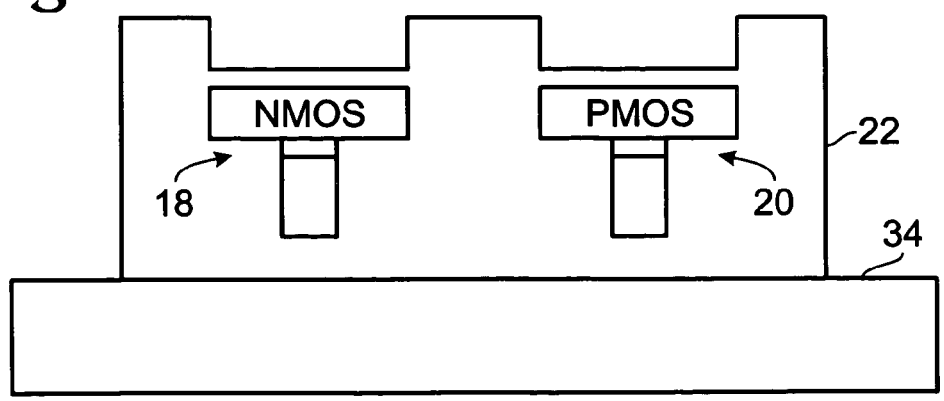

FIG. 6 depicts the fabricated IC device after the remaining silicon from the silicon substrate and SiGe layer has been removed, e.g., by a combination of dry etch, wet etch, CMP, and a selective SiGe etch, 44. Any strained silicon devices and circuits transferred to glass panel 34 have smooth, exposed surfaces because of the selective SiGe removal step. To complete the IC device according to the method of the invention, state-of-art IC and LCD process technology are followed to make connections within the strained silicon IC, and between the strained silicon IC and the pixel TFTs, thus completing the IC device or LCD on the glass panel, 46. Strained silicon devices may be provided for any required peripheral circuits and amorphous-silicon or polysilicon may be used for pixel TFTs for the display applications.

Thus, a method for fabricating strained silicon devices transfer to glass for display applications has been disclosed. It will be appreciated that further variations and modifications thereof may be made within the scope of the invention as defined in the appended claims.

We claim:

1. A method of fabricating strained silicon devices for transfer to glass for display applications, comprising:
    preparing a wafer having a silicon substrate thereon;
    forming a relaxed SiGe layer on the silicon substrate;
    forming a strained silicon layer on the relaxed SiGe layer;
    fabricating an IC device on the strained silicon layer;
    depositing a dielectric layer on the wafer to cover the IC device;
    smoothing the dielectric;
    implanting ions to form a defect layer;
    cutting the wafer into individual silicon dies;
    preparing a glass panel and the silicon dies for bonding;
    bonding the silicon dies onto the glass panel to form a bonded structure;
    annealing the bonded structure;
    splitting the bonded structure along the defect layer;
    removing the remaining silicon layer from the silicon substrate and relaxed SiGe layer on the silicon die on the glass panel; and
    completing the glass panel circuitry.

2. The method of claim 1 wherein said implanting ions includes implanting ions taken from the group of ions consisting of $H^+$, $H_2^+$, $Ar^+$, $He^+$, and combinations thereof.

3. The method of claim 1 wherein said implanting includes implanting ions into the silicon substrate.

4. The method of claim 1 wherein said implanting includes implanting ions into the SiGe layer.

5. The method of claim 1 wherein said removing the remaining silicon from the silicon substrate and SiGe layer includes removing the remaining silicon from the silicon substrate and SiGe layer by a method taken from the group of methods taken from dry etch, wet etch, CMP, a selective etch and a combination of such methods.

6. A method of fabricating strained silicon devices for transfer to glass for display applications, comprising:
    preparing a wafer having a silicon substrate thereon;
    forming a relaxed SiGe layer on the silicon substrate;
    forming a strained silicon layer on the relaxed SiGe layer;
    fabricating an IC device on the strained silicon layer;
    depositing a dielectric layer on the wafer to cover a gate module of the IC device;
    smoothing the dielectric;
    implanting ions to form a defect layer, including implanting ions taken from the group of ions consisting of $H^+$, $H_2^+$, $Ar^+$, $He^+$, and combinations thereof;
    preparing a glass panel and the silicon dies for bonding;
    bonding the silicon dies onto the glass panel to form a bonded structure;
    annealing the bonded structure;
    splitting the bonded structure along defect layer;
    removing the remaining silicon layer from the silicon substrate and relaxed SiGe layer on the silicon die on the glass panel; and
    completing the glass panel device.

7. The method of claim 1 wherein said implanting includes implanting ions into the silicon substrate.

8. The method of claim 6 wherein said implanting includes implanting ions into the SiGe layer.

9. The method of claim 6 wherein said removing the remaining silicon from the silicon substrate and SiGe layer includes removing the remaining silicon from the silicon substrate and SiGe layer by a method taken from the group of methods taken from dry etch, wet etch, CMP, a selective etch and a combination of such methods.

10. A method of fabricating strained silicon devices for transfer to glass for display applications, comprising:
  preparing a wafer having a silicon substrate thereon;
  forming a relaxed SiGe layer on the silicon substrate;
  forming a strained silicon layer on the relaxed SiGe layer;
  fabricating an IC device on the strained silicon layer;
  depositing a dielectric layer on the wafer to cover the IC device;
  smoothing the dielectric;
  implanting ions to form a defect layer wherein said implanting includes implanting ions into the SiGe layer;
  cutting the wafer into individual silicon dies;
  preparing a glass panel and the silicon dies for bonding;
  bonding the silicon dies onto the glass panel to form a bonded structure;
  annealing the bonded structure;
  splitting the bonded structure along the defect layer;
  removing the remaining silicon layer from the silicon substrate and relaxed SiGe layer on the silicon dies on the glass panel; and
  completing the glass panel circuitry.

11. The method of claim 10 wherein said implanting ions includes implanting ions taken from the group of ions consisting of $H^+$, $H_2^+$. $Ar^+$, $He^+$, and combinations thereof.

12. The method of claim 10 wherein said removing the remaining silicon from the silicon substrate and SiGe layer includes removing the remaining silicon from the silicon substrate and SiGe layer by a method taken from the group of methods taken from dry etch, wet etch, CMP, a selective etch and a combination of such methods.

* * * * *